US008304833B2

(12) United States Patent
Mazure et al.

(10) Patent No.: US 8,304,833 B2
(45) Date of Patent: Nov. 6, 2012

(54) MEMORY CELL WITH A CHANNEL BURIED BENEATH A DIELECTRIC LAYER

(75) Inventors: Carlos Mazure, Bernin (FR); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 112 days.

(21) Appl. No.: 12/974,822

(22) Filed: Dec. 21, 2010

(65) Prior Publication Data

US 2011/0169087 A1    Jul. 14, 2011

(30) Foreign Application Priority Data

Jan. 14, 2010  (FR) ...................................... 10 50240

(51) Int. Cl.
H04L 27/12  (2006.01)
(52) U.S. Cl. ........ 257/347; 257/330; 257/332; 257/348; 257/E29.242; 257/E21.409
(58) Field of Classification Search .................. 257/330, 257/332, 347, 348, E29.242, E21.409
See application file for complete search history.

(56) References Cited

U.S. PATENT DOCUMENTS

| 4,169,233 | A | 9/1979 | Haraszti ........................ 307/355 |
| 5,028,810 | A | 7/1991 | Castro et al. .................. 307/201 |
| 5,306,530 | A | 4/1994 | Strongin et al. .............. 427/533 |
| 5,325,054 | A | 6/1994 | Houston ........................ 324/158 |
| 5,455,791 | A | 10/1995 | Zaleski et al. ............ 365/185.26 |
| 5,557,231 | A | 9/1996 | Yamaguchi et al. .......... 327/534 |
| 5,608,223 | A | 3/1997 | Hirokawa et al. ........ 250/447.11 |
| 5,646,900 | A | 7/1997 | Tsukude et al. .............. 365/205 |
| 5,753,923 | A | 5/1998 | Mera et al. ................. 250/443.1 |
| 5,844,845 | A | 12/1998 | Tahara ...................... 365/189.05 |
| 5,869,872 | A | 2/1999 | Asai et al. ...................... 257/360 |
| 5,889,293 | A | 3/1999 | Rutten et al. .................... 257/74 |
| 6,043,536 | A | 3/2000 | Numata et al. ................ 257/347 |
| 6,063,686 | A | 5/2000 | Masuda et al. ................ 438/406 |
| 6,072,217 | A | 6/2000 | Burr ............................. 257/351 |
| 6,108,264 | A | 8/2000 | Takahashi et al. ........ 365/230.03 |
| 6,141,269 | A | 10/2000 | Shiomi et al. ................. 365/200 |
| 6,300,218 | B1 | 10/2001 | Cohen et al. .................. 438/423 |

(Continued)

FOREIGN PATENT DOCUMENTS

EP  1 081 748  A2  3/2001

(Continued)

OTHER PUBLICATIONS

U.S. Appl. No. 12/793,553, filed Jun. 3, 2010.

(Continued)

*Primary Examiner* — Tan N Tran
(74) *Attorney, Agent, or Firm* — Winston & Strawn LLP

(57) ABSTRACT

The invention provides various embodiments of a memory cell formed on a semiconductor-on-insulator (SeOI) substrate and comprising one or more FET transistors. Each FET transistor has a source region and a drain region at least portions of which are arranged in the thin layer of the SeOI substrate, a channel region in which a trench is made, and a gate region formed in the trench. Specifically, the source, drain and channel regions also have portions which are arranged also beneath the insulating layer of the SeOI substrate; the portion of channel region beneath the insulating layer extends between the portions of the source and drain regions also beneath the insulating layer; and the trench in the channel region extends into the depth of the base substrate beyond the insulating layer. Also, methods for fabricating such memory cells and memory arrays including a plurality of such memory cells.

22 Claims, 5 Drawing Sheets

U.S. PATENT DOCUMENTS

| | | | |
|---|---|---|---|
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,611,023 B1 | 8/2003 | En et al. | 257/350 |
| 6,825,524 B1 | 11/2004 | Ikehashi et al. | 257/314 |
| 7,109,532 B1 | 9/2006 | Lee et al. | 257/133 |
| 7,112,997 B1 | 9/2006 | Liang et al. | 326/81 |
| 7,447,104 B2 | 11/2008 | Leung | 365/230.06 |
| 7,449,922 B1 | 11/2008 | Ricavy | 327/57 |
| 2001/0038299 A1 | 11/2001 | Afghahi et al. | 326/86 |
| 2001/0047506 A1 | 11/2001 | Houston | 716/4 |
| 2002/0105277 A1 | 8/2002 | Tomita et al. | 315/111.81 |
| 2002/0114191 A1 | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 | 4/2005 | Zheng et al. | 257/315 |
| 2005/0110078 A1 | 5/2005 | Shino | 257/331 |
| 2005/0255666 A1 | 11/2005 | Yang | 438/401 |
| 2005/0276094 A1 | 12/2005 | Yamaoka et al. | 365/154 |
| 2006/0013028 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0291321 A1 | 12/2006 | Leung | 365/230.06 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1 | 4/2007 | Hamamoto | 257/347 |
| 2007/0076467 A1 | 4/2007 | Yamaoka et al. | 365/154 |
| 2007/0139072 A1 | 6/2007 | Yamaoka et al. | 326/113 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/208 |
| 2007/0241388 A1 | 10/2007 | Yamamoto et al. | 257/314 |
| 2007/0298549 A1 | 12/2007 | Jurczak et al. | 438/149 |
| 2008/0042187 A1 | 2/2008 | Hwang | 257/316 |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/181 |
| 2008/0173916 A1 | 7/2008 | Nishihara | 257/298 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2009/0003105 A1 | 1/2009 | Itoh et al. | 365/203 |
| 2009/0010056 A1 | 1/2009 | Kuo et al. | 365/184 |
| 2009/0086535 A1 | 4/2009 | Ferrant et al. | 365/174 |
| 2009/0096011 A1 | 4/2009 | Hong et al. | 257/321 |
| 2009/0096036 A1 | 4/2009 | Ishigaki et al. | 257/392 |
| 2009/0096936 A1 | 4/2009 | Hamada et al. | 348/731 |
| 2009/0101940 A1 | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0310431 A1 | 12/2009 | Saito | 365/207 |
| 2010/0032761 A1 | 2/2010 | Ding et al. | 257/350 |
| 2010/0035390 A1 | 2/2010 | Ding et al. | 438/152 |
| 2010/0079169 A1 | 4/2010 | Kim et al. | 326/120 |
| 2010/0117684 A1 | 5/2010 | Kim et al. | 326/120 |

FOREIGN PATENT DOCUMENTS

| | | |
|---|---|---|
| EP | 1 095 407 A1 | 5/2001 |
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 | 6/2009 |
| JP | 04345064 A | 12/1992 |
| JP | 08255846 | 10/1996 |
| JP | 09232446 | 9/1997 |
| JP | 10125064 A | 5/1998 |
| JP | 2000196089 A | 7/2000 |
| JP | 2004303499 | 10/2004 |
| KR | 10-2008-0081550 A | 9/2008 |
| WO | WO 99/66559 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

U.S. Appl. No. 12/793,515, filed Jun. 3, 2010.
U.S. Appl. No. 12/789,100, filed May 27, 2010.
U.S. Appl. No. 12/886,421, filed Sep. 20, 2010.
U.S. Appl. No. 12/880,806, filed Sep. 13, 2010.
U.S. Appl. No. 12/898,230, filed Oct. 5, 2010.
U.S. Appl. No. 12/942,754, filed Nov. 9, 2010.
U.S. Appl. No. 12/946,135, filed Nov. 15, 2010.
U.S. Appl. No. 12/961,293, filed Dec. 6, 2010.
U.S. Appl. No. 12/974,916, filed Dec. 21, 2010.
U.S. Appl. No. 12/984,466, filed Jan. 4, 2011.
U.S. Appl. No. 13/007,483, filed Jan. 14, 2011.
U.S. Appl. No. 13/013,580, filed Jan. 25, 2011.
U.S. Appl. No. 13/039,167, filed Mar. 2, 2011.
European Search Report Application No. EP 09290838.3 dated Feb. 16, 2010.
European Search Report Application No. EP 10 29 0217 dated Sep. 15, 2010.
European Search Report Application No. EP 10290181.6 dated Jan. 14, 2011.
John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).
John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).
Paul Beckett, XP-002579039, "Performance Characteristics of a Nanoscale Double-gate Reconfigurable Array", Proc. of SPIE, vol. 7268, pp. 72680E-1-72680E-12 (2008).
I. Hassoune et al. "Double-gate MOSFET Based Reconfigurable Cells", The Institution of Engineering and Technology, Electronics Letters, vol. 43, No. 23, 3 pages (2007).
K. Cheng, et al., "Extremely Thin SOI (ETSOI) CMOS with Record Low Variability for Low Power System-on-Chip Applications", IBM Research at Albany Nanotech, pp. 3.2.1-3.2.4( 2009).
P.J. Klim et al, "A 1 MB Cache Subsystem Prototype With 1.8 ns Embedded DRAMs in 45 nm SOI CMOS", IEEE, Journal of Solid-State Circuits, vol. 44, No. 4, pp. 1216-1226 (2009).
K. J. Kuhn, "Variation in 45nm and Implications for 32nm and Beyond", Intel, 2009 $2^{nd}$ International CMOS Variability Conference—London, pp. 1-86.
Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).
D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).
K. Itoh, et al., "Impact of FD-SOI on Deep-Sub-100-nm CMOS LSIs—A View of Memory Designers" Central Research Laboratory, Tokyo, Japan, 2 pages.
R. Kaushik, et al. "Double-Gate SOI Devices for Low-Power and High-Performance Applications", IEEE Computer Society, The British Library, IEEE Xplore, 8 pages, (2006).
M. Mizukami, et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).

M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).

S. Mukhopadhyay, et al., "A Novel High-Performance and Robust Sense Amplifier Using Independent Gate Control in Sub-50-nm Double-Gate MOSFET," IEEE Transactions on Very Large Scale Integration (VLSI) Systems, vol. 14, No. 2, pp. 183-192 (2006).

S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).

P. Nasalski, et al. "An Innovative sub-32nm SRAM Voltage Sense Amplifier in Double-Gate CMOS Insensitive to Process Variations and Transistor Mismatch" The 15$^{th}$ IEEE International Conference on Electronics, Circuits and Systems, pp. 554-557, (ICECS 2008).

P. Nasalski, et al. "SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).

T. Ohtou, et al. "Threshold-Voltage Control of AC Performance Degradation-Free FD SOI MOSFET With Extremety Thin BOX Using Variable Body-Factor Scheme", IEEE Transactions on Electron Devices, vol. 54, No. 2, pp. 301-307, (2007).

R. Tsuchiya, et al., "Silicon on Thin BOX: A New Paradigm of the CMOSFET for Low-Power and High-Performance Application Featuring Wide-Range Back-Bias Control" 2004 IEEE, 4 pages.

R. Tsuchiya, et al., "Controllable Inverter Delay and Suppressing V$_{th}$ Fluctuation Technology in Silicon on Thin BOX Featuring Dual Back-Gate Bias Architecture," Central Research Laboratory, Tokyo, Japan, IEEE, pp. 475-478 (2007).

Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).

M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).

M. Yamaoka, et al., "Dynamic-Vt Dual-Power-Supply SRAM Cell using D2G-SOI for Low-Power SoC Application," IEEE International SOI conference, Oct. 2004, pp. 109-111 (2004).

Ulicki, Bob et al., "De-Myth-tifying" the SOI Floating Body Effect, SOI Industry Consortium, pp. 2-7 (2009).

MEMORY CELL WITH A CHANNEL BURIED BENEATH A DIELECTRIC LAYER

FIELD OF THE INVENTION

The field of the invention relates to semiconductor devices and more particularly to memory devices comprising a plurality of memory cells formed by an FET (Field-Effect Transistor) having a floating channel or a floating gate, and also to a memory array having a plurality of memory cells of this type.

BACKGROUND OF THE INVENTION

FIG. 1 shows a sectional view of a conventional floating-channel DRAM memory cell (DRAM being the acronym for Dynamic Random Access Memory). This cell is formed in an SOI (Silicon-On-Insulator) substrate comprising a thin silicon layer 3 separated from the semiconductor substrate 1 via a buried oxide layer 2 (BOX). A floating channel 4, a source region 5 and a drain region 6 are formed in the thin layer 3 above the BOX layer 2. A gate dielectric layer 7 and a control gate electrode 8 are deposited sequentially above the floating channel 4. The drain region 6 is connected to a bit line BL, the source region 5 is connected to a source line SL and the gate electrode 8 is connected to a word line WL.

The floating channel is electrically isolated by the BOX layer, the gate dielectric layer, the source region and the drain region. Because of this isolation, the floating channel can store electrical charge, leading to the same result as with a capacitor.

During an operation of writing data into such a transistor, the floating channel stores charges through an impact ionization effect, thereby modifying the threshold voltage of the transistor. During a data read operation, the amount of current flowing between the source and the drain of the transistor thus depends on the quantity of charge stored in the floating channel.

Although fabricating smaller transistors enables a larger number of them to be integrated on one and the same substrate, the scaling-down can lead to undesirable effects. In particular, FET transistors having a channel of relatively short length may have undesirable electrical characteristics known as short channel effects (SCE). Because of the continuous reduction in size of semiconductor devices, the SCE phenomenon proves to be increasingly problematic.

One solution for this reduction in physical dimensions of integrated circuits consists in forming what are called "buried gate" transistors that have a gate region buried in the channel. Unlike a conventional planar transistor for which the control gate electrode is formed on the surface of the substrate above the channel (being isolated therefrom by a gate dielectric layer), a buried-gate transistor has a control gate electrode that fills a trench formed in the thickness of the channel. By providing a gate region that extends into the substrate, the effective length of the channel is increased, thereby enabling the buried-gate RCAT transistor to have a smaller SCE.

Such a transistor, also known by the acronym RCAT (Recess Channel Array Transistor), is for example described in document U.S. 2006/0220085.

Although such RCAT transistors help to solve problems associated with channel size reduction in the case of 65 nm and 45 nm technologies, the fact remains that the volume of the channel is so small in the case of the next-generation (especially 32 nm) technologies that only a small quantity of charge can then be stored therein. It will therefore be understood that a variation in only a few charges can then lead to relatively large perturbations.

To give an illustrative example, an SOI-based planar transistor can only contain a few tens of charges. The loss of only a single charge then represents signal loss of around 2%. Now, each access to a cell that shares a connection with a cell in retention mode may potentially disturb said cell by "pumping," for example, one or more charges at each cycle.

There is therefore a need for memory cells that obviate the aforementioned drawbacks of the prior art due to the small channel volume.

SUMMARY OF THE INVENTION

The present invention provides memory cells that obviate the drawbacks of short channel effects and small channel volumes.

More specifically, the invention provides various embodiments of a memory cell formed on a semiconductor-on-insulator (SeOI) substrate and comprising one or more FET transistors. Each FET transistor has a source region and a drain region at least portions of which are arranged in the thin layer of the SeOI substrate, a channel region in which a trench is made, and a gate region formed in the trench. Specifically, the source, drain and channel regions also have portions which are arranged also beneath the insulating layer; the portion of channel region beneath the insulating layer extends between the portions of the source and drain regions also beneath the insulating layer; and the trench in the channel region extends into the depth of the base substrate beyond the insulating layer.

The invention also provides various improvements to a process for fabricating a memory cell in a semiconductor-on-insulator (SeOI) substrate comprising an FET transistor, the SeOI substrate including a thin layer of semiconductor material separated from a base substrate by an insulating layer, the FET transistor including a source region and a drain region arranged at least (preferably) integrally in the thin layer of the SeOI substrate.

More specifically, the provided improvements to this process, where a channel region that extends between the source region and the drain region at least (preferably) essentially beneath the insulating layer, comprise forming a trench in the channel region that extends beyond the insulating layer; covering the walls of the trench with a layer of a semiconductor material; carrying out a recrystallization annealing operation on the semiconductor material providing the walls of the trench so as to define the channel conduction region on either side of the trench at the insulating layer level and the lateral faces of the trench; providing the walls of the trench with a dielectric layer; and forming a gate region in the trench by filling the trench. Preferably, the recrystallization annealing operation causes the semiconductor material to recrystallize in a single-crystalline state in the regions located above and beneath the insulating layer, and in a polycrystalline state at the insulating layer level. Also, the walls of the trench are preferably completely covered by the semiconductor and dielectric materials.

The invention also provides improvements to a further process for fabricating a memory cell in a semiconductor-on-insulator (SeOI) substrate comprising an FET transistor, the SeOI substrate including a thin layer of semiconductor material separated from a base substrate by an insulating layer, the FET transistor including a source region and a drain region arranged at least (preferably) essentially in the thin layer of the SeOI substrate above the insulating layer, and a channel that extends (preferably) integrally beneath the insulating layer.

More specifically, one provided improvement to this process comprises forming, immediately beneath the insulating layer, a doped layer intended to define a further portion of the source region and a further portion of drain region that extend beneath the insulating layer on either side of a trench; forming the trench in the semiconductor-on-insulator substrate so that the trench extends beyond the insulating layer between the parts of the source and drain regions that are located beneath the insulating layer; providing the walls of the trench with a layer of semiconductor material; providing the walls of the trench with a dielectric layer; forming a gate region by filling the trench; and causing the dopant to diffuse along the walls of the trench at the insulating layer level from the source and drain regions located above and beneath the insulating layer respectively, so as to form a source conduction zone and a drain conduction zone enabling the source regions and the drain regions, which extend above and beneath the insulating layer, respectively, to be connected. Preferably, the walls of the trench are completely covered by the semiconductor and dielectric materials.

More specifically, another provided improvement to this process comprises forming a first trench in the semiconductor-on-insulator substrate, the first trench extending from the surface of the semiconductor-on-insulator substrate down to the base substrate; providing the walls of the first trench with spacers of a doped semiconductor material having a conductivity of the same type as those of the drain and source regions that extend above the insulating layer; forming a second trench in the first trench, said second trench extending into the depth of the base substrate beyond the insulating layer from the bottom of the first trench; providing the walls of said second trench and of the first trench with a dielectric layer; forming a gate region by filling said second trench and the first trench; and forming localized source and drain regions immediately beneath the insulating layer on either side of said second trench by dopant diffusion from the spacers, the spacers serving, after dopant diffusion, as channel conduction zones and drain conduction zones respectively, in order to connect the source and drain regions that extend above and beneath the insulating layer. Preferably, the walls of the trench are completely covered by the doped semiconductor and dielectric materials.

The invention also provides methods for fabricating memory cells of the invention and memory arrays comprising a plurality of memory cells of the invention.

Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

Figure 1:
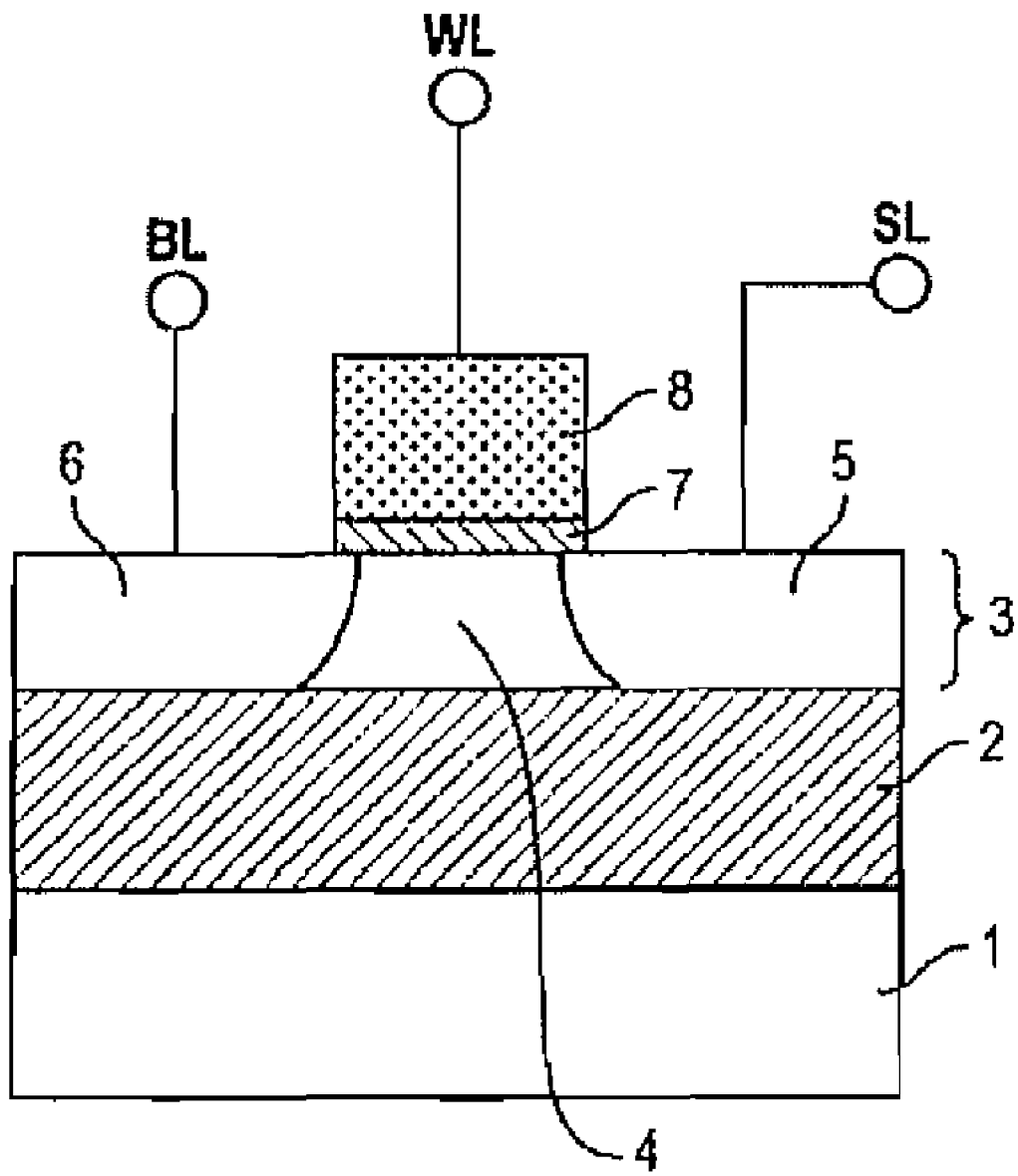
FIG. 1 illustrates a conventional floating-channel DRAM cell.

Certain terms are used herein with the following definitions.

The term "integrally" is used to mean at least "substantially all," and preferably "all." Accordingly, the phrase "the drain is arranged integrally in the thin layer" means that all the drain is in the thin layer, and if not all in the thin layer, then the portion not in the thin layer has no commercial or practical effect.

The term "essentially" is used to mean from "a majority" to "a very large majority" but not "all" or "substantially all." Accordingly, the phrase "the channel lies essentially below the insulating layer" means that a (volume) ratio of the portion of the channel below the insulating layer to the portion elsewhere is at least between 50 and 1000, preferably between 100 and 1000, and more preferably between 200 and 1000. However, not all of the channel is below the insulating layer, and the portion not below the insulating layer is expected to have some commercial or practical effects.

The term "substantially" is used to mean result that is complete except for the deficiencies normally expected in the art. Also, the description of a range is understood to also include description of all specific values within the described range.

As noted herein, the invention relates to a memory cell formed on a semiconductor-on-insulator (SeOI) substrate and comprising one or more FET transistors, each of which having a source region and a drain region at least portions of which are arranged in the thin layer of the SeOI substrate, a channel region in which a trench is made, and a gate region formed in the trench.

Certain preferred, but non-limiting, aspects of this memory cell are the following:

the drain region and the source region are arranged (preferably) integrally (that is, preferably all with any residual amount having no commercial or practical effect) in the thin layer of the semiconductor-on-insulator substrate, and a channel conduction region is arranged at the insulating layer level on either side of the trench so that the channel extends between the source region and the drain region both above and beneath the insulating layer via the channel conduction region;

the source and drain regions extend both above and beneath the insulating layer via a source conduction zone and a drain conduction zone respectively, the zones being arranged at the insulating layer level on either side of the trench, and the channel extends (preferably) integrally (that is, preferably all with any residual amount having no commercial or practical effect) beneath the insulating layer between the parts of the source and drain regions that are located beneath the insulating layer;

the gate region is separated from the channel by a dielectric layer;

that part of the channel beneath the insulating layer is formed by a well made in the upper part of the base substrate;

the well is isolated from the remaining part of the base substrate by a layer of opposite conductivity to that of the well;

the cell further includes lateral isolation regions of that part of the channel located beneath the insulating layer which extend depthwise beneath the insulating layer;

the FET transistor is partially depleted and the cell furthermore comprises lateral isolation regions of that part of the channel located above the insulating layer;

the channel is floating and the gate region serves as control gate electrode for driving the FET transistor;

the cell further comprises a bipolar transistor where the collector of the bipolar transistor serves as channel for the FET transistor, the source of the FET transistor serves as base for the bipolar transistor, and the base substrate serves as base for the bipolar transistor; and the gate region is floating and the FET transistor further comprises a control gate electrode isolated from the floating gate region via a dielectric layer.

Preferred but non-limiting embodiments of the invention are now described. It should be noted that the terms "essentially" and "integrally" are defined above and should be understood to have the defined meaning wherever used in the specification or claims.

Figure 2A:
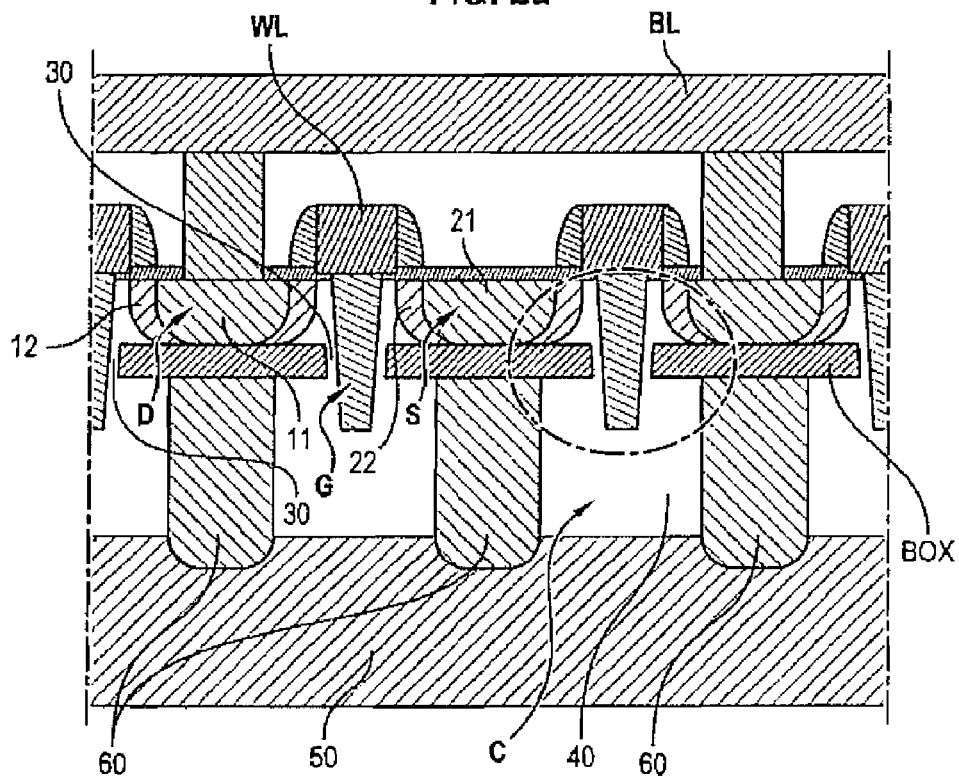
FIG. 2a illustrates an example of a DRAM memory cell according to an embodiment of the invention.

FIG. 2a shows a sectional view of a DRAM memory cell according to a first general embodiment of the invention that comprises an FET transistor having a source S, a drain D and a channel C between the source and the drain. The memory cell is produced on an SeOI (Semiconductor-On-Insulator) substrate, preferably an SOI (Silicon-On-Insulator) substrate, comprising a thin layer of semiconductor material separated from a base substrate by an insulating layer, for example a buried oxide layer BOX.

In this first embodiment, the drain D and the source S are arranged, preferably integrally (that is, preferably all with any residual amount having no commercial or practical effect), in the thin layer of the SeOI substrate. The channel C itself extends both above and beneath the insulating layer. The difference in volume (typically by a factor of between 200 and 1000) between that part of the channel located above the insulating layer and that part of the channel located beneath the insulating layer is such that the channel can be considered to lie, preferably essentially (that is a majority to, preferably, a very large majority but not all), beneath the insulating layer.

In FIG. 2a, the drain D and the source S are in contact with the insulating layer BOX so that the FET transistor is fully depleted. The source S may thus be shared between two adjacent memory cells (along a row of a memory array lying in the plane of FIG. 2a. the columns of the memory array lying perpendicular to the plane of FIG. 2a). Such sharing enables the footprint of a memory cell to be reduced.

However, the invention is not limited to a fully depleted memory cell but also extends to a partially-depleted SeOI memory cell (not shown). It therefore proves necessary to isolate, in a conventional manner, the cells along a row of the memory array so as to create the floating-channel effect. This is conventionally accomplished by means of lateral isolation trenches that extend depthwise from the surface of the substrate down to the BOX layer. These trenches typically provide what is called STI (Shallow Trench Isolation).

The drain D may be connected, in a conventional manner, to a bit line BL. This bit line BL may extend along a row of the memory array, contacting the drain of each of the memory cells placed along this row.

The source S itself may be connected to a source line SL. This source line SL typically lies perpendicular to the bit line BL, contacting the source of each of the memory cells placed along a column of the memory array. In the case already mentioned above and shown in FIG. 2a, in which the source is shared between two adjacent cells, a single source line SL then serves to address the sources of the two memory cells.

Returning to the description of FIG. 2a, the source S typically comprises a highly doped (for example $n^+$-doped) central zone 21 serving mainly for making contact with the source line SL and a lightly doped (for example $n^-$-doped) peripheral zone 22 surrounding the central zone and serving mainly for operating the transistor. It should be noted that the drain D may also have a highly doped central zone 11 ($n^+$-doped in the example) serving mainly for making contact with the bit line BL and a lightly doped peripheral zone 12 ($n^-$-doped in the example) surrounding the central zone and serving mainly for operating the transistor.

The example given here is an n-type FET transistor memory cell. However, it will be understood that the invention is not limited to this type of transistor, rather it extends also to a p-type FET transistor memory cell.

In the context of the invention, the channel has a trench and the FET transistor further includes a gate region G in the trench. The trench extends from the surface of the semiconductor-on-insulator substrate beyond the insulating layer, depthwise into the base substrate. The trench has a bottom and sidewalls connected together via the bottom. It will be recalled that, along a column of a memory array, the cells have isolation trenches for isolating the cells of the column from one another. The gate region in the trench is thus bounded longitudinally by these isolation trenches.

Figure 2B:
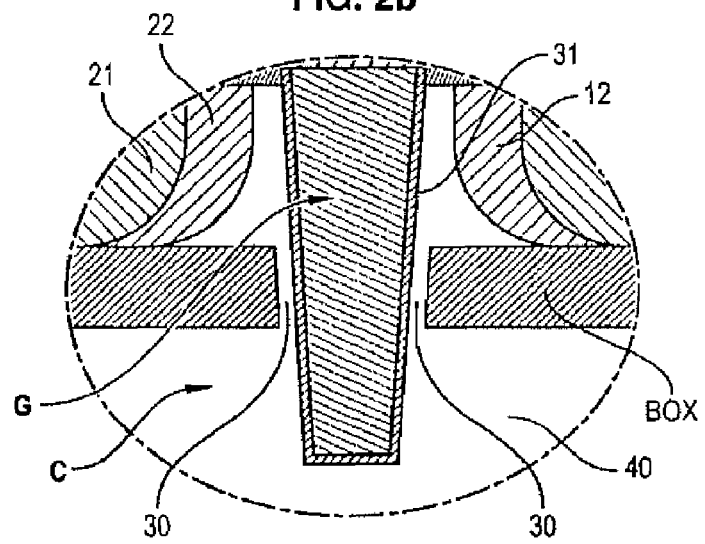
FIG. 2b is an enlarged view of FIG. 2a illustrating the presence of a channel conduction region on either side of the trench at the insulating layer level.

A channel conduction region 30 (cf. FIG. 2b, showing an enlarged view of the region circled in FIG. 2a) is moreover made at the insulating layer level between the insulating layer and the sidewalls of the trench so that the channel can extend between the source and the drain both above and beneath the insulating layer via the channel conduction region (the channel thus extending, preferably essentially, beneath the insulating layer in view of the difference in volume between that part of the channel located above the insulating layer and that part of the channel located beneath the insulating layer). The gate region G in the trench is separated from the channel C and from the channel conduction region 30 by a dielectric layer 31 deposited beforehand on the walls of the trench.

One possible way of producing the channel conduction region 30 is now explained in detail. The trench is firstly formed in the SeOI substrate so as to extend from the surface of the semiconductor-on-insulator substrate beyond the insulating layer, depthwise into the base substrate. To do this, a trench mask having etching patterns with a diameter, for example, of around 40 nm is used.

The walls of the trench are then coated with a layer of semiconductor material, preferably silicon. More particularly, amorphous silicon may be conformally deposited on the entire surface of the SeOI substrate (on the mask and along the sidewalls and the bottom of the trench). By using an amorphous material it is possible in particular for the crystallographic arrangement of the material constituting the thin layer of the SeOI substrate not to be damaged. Alternatively, ALD (Atomic Layer Deposition) may be used for depositing a single silicon atom layer. Typically, the thickness of amorphous silicon deposited is less than the thickness of 10 atomic layers (5 mm).

Next, a gentle etching step is carried out in order to remove the deposited silicon layer present above the trench mask.

Next, a recrystallization annealing operation is carried out on the silicon deposited along the walls of the trench, in such a way that the silicon recrystallizes in a single-crystal state in the regions of the trench located above and beneath the insulating layer, and in a polycrystalline state at the insulating layer level so as to define the channel conduction region 30 on either side of the trench between the insulating layer BOX and the walls of the trench. Recrystallization at the insulating layer level may also take place especially via recrystallization fronts coming from the semiconductor regions present above and beneath the insulating layer. Depending on the thickness of the insulating layer, the recrystallization fronts may even meet.

Next, the recrystallized silicon layer is covered with a gate dielectric layer 31.

Finally, the trench is then filled in order to form the gate region G therein, for example by depositing doped polysilicon. As a variant, the gate region may be metallized.

Returning to the description of FIG. 2a, that part of the channel located beneath the insulating layer is preferably formed by a well 40 produced in the upper part of the base substrate. The well 40 may especially be isolated from the remaining part of the base substrate by a layer 50 of opposite conductivity to that of the well (a layer of n⁻-type conductivity when the well is of p⁻-type conductivity in the example presented here of an n-channel memory cell biased with $V_{dd}$ so as to force the diode created to be in reverse bias mode, the reverse reasoning applying to a p-channel cell).

The memory cell further comprises lateral isolation regions 60 for isolating that part of the channel located beneath the insulating layer. Lateral isolation regions 60 extend depthwise beneath the insulating layer until reaching the layer 50 (opposite conductivity to that of the well) for isolating the well 40 from the remaining part of the base substrate. It should be noted that these regions 60 fulfill the same function as the STI-type isolation regions placed above the insulating layer in the case of partially-depleted SeOI memory cells, as mentioned previously.

According to a first possible embodiment, these lateral isolation regions 60 of that part of the channel located beneath the insulating layer are isolation trenches produced using STI technology. According to a second possible embodiment, these regions 60 are formed from a semiconductor material of opposite conductivity to that of the channel (n⁺-type conductivity in the example described here of a p⁻-type channel region 40).

According to a preferred embodiment of the invention (shown in FIG. 2a), the channel is floating, and the gate region serves as control gate electrode for driving the FET transistor. Thus, a DRAM memory cell is defined for which a write operation makes it possible, via an impact ionization effect, to store charges in the floating channel that extends both above and beneath the insulating BOX layer.

Thus, in the present invention, the charge storage volume is particularly increased (cf. the 200 to 1000 factor mentioned previously) compared with that of conventional cells owing to the extension of the floating channel beneath the insulating layer. Therefore, the quantity of charge that can be stored in the floating channel of a cell according to the invention may remain relatively constant even as the road-map of technological developments towards leads towards ever greater reduction in the size of semiconductor devices. At the very least, the charge stored can decrease less rapidly than might be observed with conventional cells. This means that the reduction in size of semiconductor memory devices along the X and Y axes (along the rows and columns of the memory array) may be compensated for by the floating channel being buried more deeply beneath the insulating layer.

Moreover, the peripheral circuits (amplifiers and decoders) of a memory array consisting of memory cells according to the invention may remain in conventional SOI technology using planar transistors. This makes it possible to reduce the problems of variability, power consumption, etc.

According to another general embodiment of the invention (not shown), the gate region is floating and the FET transistor further comprises a control gate electrode isolated from the floating gate region by means of a dielectric layer. Thus, a flash-type memory cell is defined for which a write operation makes it possible, by the phenomenon of hot carrier injection, to store charge in the floating gate region formed in the trench that extends into the channel beneath the insulating BOX layer. Here, the storage volume is itself increased because of the larger size of the floating gate region formed in the trench that extends beneath the insulating layer. This embodiment proves to be especially advantageous for reducing the overall size of power transistors requiring high operating voltages.

FIGS. 3a-3b and 4a-4b show two further embodiments of a DRAM memory cell according to the invention that are based on the first general embodiment described with reference to FIGS. 2a-2b. In these embodiments, a bipolar transistor is associated with the FET transistor in such a way that the collector of the bipolar transistor is formed by the channel of the FET transistor. Accordingly, the bipolar transistor can inject charge into the channel of the FET transistor.

Figure 3A:
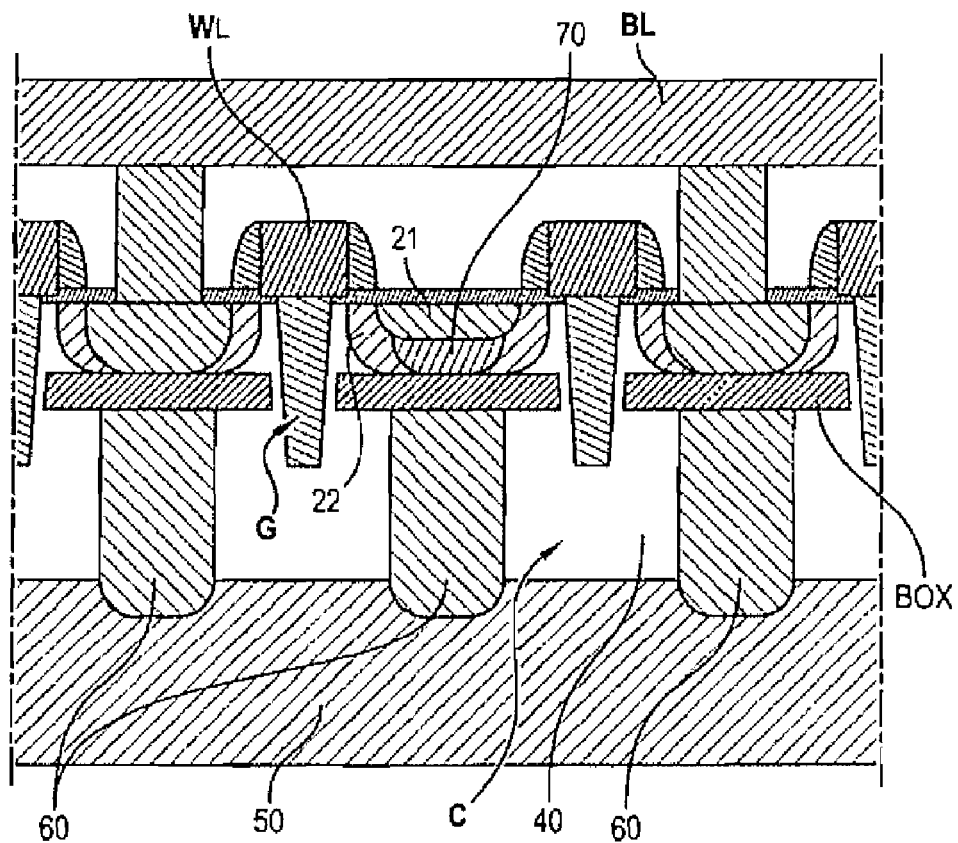
FIGS. 3a and 3b illustrate a sectional view and an equivalent electrical diagram, respectively, of a first example of a cell according to another embodiment of the invention, in which a bipolar transistor is associated with the FET transistor in order to inject charge into the channel of the FET transistor.
Figure 3B:
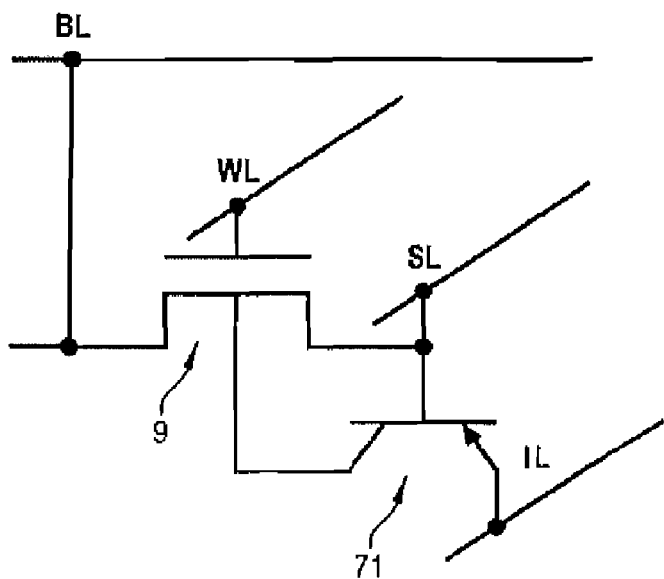

In the case of the further embodiment illustrated in FIG. 3a, the equivalent electrical diagram of which is illustrated in FIG. 3b, the emitter 70 of the bipolar transistor is designed so that the source of the FET transistor (bearing the reference 9 in FIG. 3b) serves as base for the bipolar transistor (bearing the reference 71 in FIG. 3b). Typically, the FET transistor is a horizontal transistor and the emitter is more precisely designed in such a way that the emitter/source assembly forms a vertical stack.

The emitter is preferably integrated into the source in a lower region of the latter. In the case described above, in which the source comprises a highly doped central zone 21 and a lightly doped peripheral zone 22 surrounding the central zone, the emitter 70 is then placed so as to be in contact with the central zone of the source while still being isolated from the floating channel by the peripheral zone 22 of the source. Here, the emitter is fully integrated into the source electrode between the central region 21 and the peripheral region 22 thereof. In the case of a fully depleted SeOI memory cell, and as shown in FIG. 3a, the BOX layer may also contribute to isolating the emitter from the floating channel.

Figure 4A:
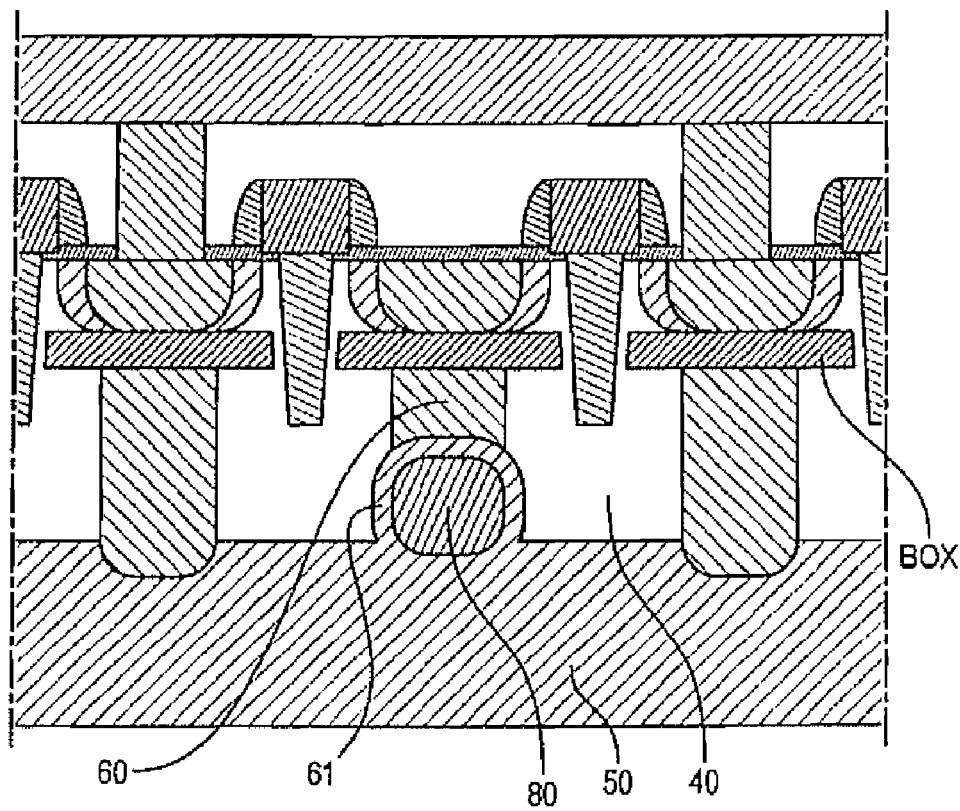
FIGS. 4a and 4b illustrate a sectional view and an equivalent electrical diagram, respectively, of another example of a cell according to the embodiment in which a bipolar transistor injects charge into the channel of the FET transistor.
Figure 4B:
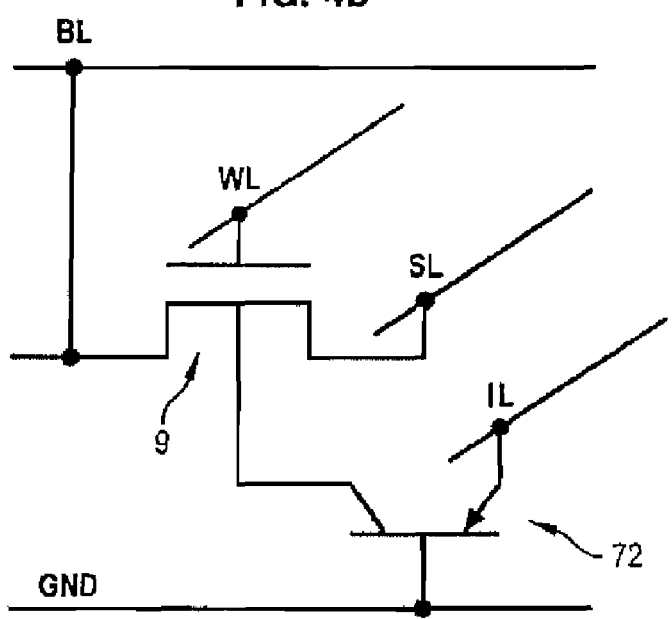

In the case of the further embodiment illustrated in FIG. 4a, the equivalent electrical diagram of which is illustrated in FIG. 4b, the isolation layer 50 of the well 40 serves as base for the bipolar transistor (bearing the reference 72 in FIG. 4b, in which the FET bears the reference 9). The emitter 80 of the bipolar transistor is thus placed so as to be in contact with the base substrate (i.e. with the isolation layer 50 of the well in the example shown).

Here, the emitter is placed in a lower part of a lateral isolation region 60 of that part of the channel located beneath the insulating layer, while still being separated from this isolation region 30 via a region which surrounds it, so as to isolate it from the floating channel, and which has the same type of conductivity as that of the base substrate (n⁻-type region in the example).

The region 60 below which the emitter lies is then preferably formed from a semiconductor material of opposite conductivity to that of the channel (n⁺-type in the example).

In each of these two further embodiments mentioned above, the emitter 70 or 80 is connected to an injection line IL that extends parallel to the source line SL so as to address the memory cells placed along a column of the memory array. This results in a particularly compact arrangement in so far as the injection line IL occupies no surface region. The injection line IL may especially be made of a doped semiconductor material (p⁺-doping of the material of a thin layer in the case of the variant shown in FIG. 3a and p⁺-doping of the material of the base substrate in the case of the variant shown in FIG. 4a).

Returning to the further embodiment illustrated in FIG. 4a, the FET and bipolar transistors are practically independent so that each can be optimized without having to seek a compromise. This further embodiment furthermore provides an additional node (via the base substrate serving as base for the bipolar transistor, and more precisely by controlling the voltage on the isolation layer 50 of the well 40, illustrated as GND in FIG. 4b). This additional node offers greater flexibility in the case of cell write/read operations.

The above description dealt with a first general embodiment of a memory cell according to the invention for which the drain region and the source region are placed, preferably integrally (that is, preferably all with any residual amount having no commercial or practical effect), in the thin layer of the semiconductor-on-insulator substrate and for which the channel extends between the source region and the drain region both above and beneath the insulating layer via the channel conduction region.

Two examples of a second general embodiment of a memory cell according to the invention is described below with reference to FIGS. 5a and 5b. In this second general embodiment, the source region S and drain region D each extend over two levels, both above and below the insulating layer. However, the source and drain regions are placed, preferably essentially (that is a majority to, preferably, a very large majority but not all), in the thin layer in so far as the source region and the drain region respectively located above the insulating layer have a substantially higher volume (typically by a factor of 200 to 1000) than the source region and drain region respectively located beneath the insulating layer.

Specifically, portions of the source are above (91, 21 and 22 in both figures) the insulating layer, and further portions of the source are beneath (92 in FIG. 5a, 93 in FIG. 5b) the insulating layer. Portions of the drain are above (101, 11 and 12 in both figures) the insulating layer, and further portions of the drain are beneath (102 in FIG. 5a, 103 in FIG. 5b) the insulating layer. In FIGS. 5a and 5b, the reference 91 (alternatively the reference 101) represents that part of the source region S (alternatively the drain region D) located above the insulating layer. The portions of the source region (alternatively the drain region) above the insulating layer include the central region 22 (alternatively 12) and the peripheral region 21 (alternatively 11). The portions of the source and of the drain above and below the insulating layer are linked via a source conduction zone 90 and a drain conduction zone 100, respectively, which are arranged at the insulating layer level on either side of the trench.

The channel C itself extends preferably integrally (that is, preferably all with any residual amount having no commercial or practical effect), beneath the insulating layer between the portions 92 (FIGS. 5a) and 93 (FIG. 5b) of the source region located beneath the insulating layer and the portion 102 (FIGS. 5a) and 103 (FIG. 5b), respectively, of the drain region located beneath the insulating layer. As with the embodiment illustrated in FIG. 2a, the memory cells of FIGS. 5a and 5b may further comprises lateral channel isolation regions extending depthwise beneath the insulating layer until reaching the layer 50 and which sever to isolate the well 40 from the remaining part of the base substrate.

Figure 5A:
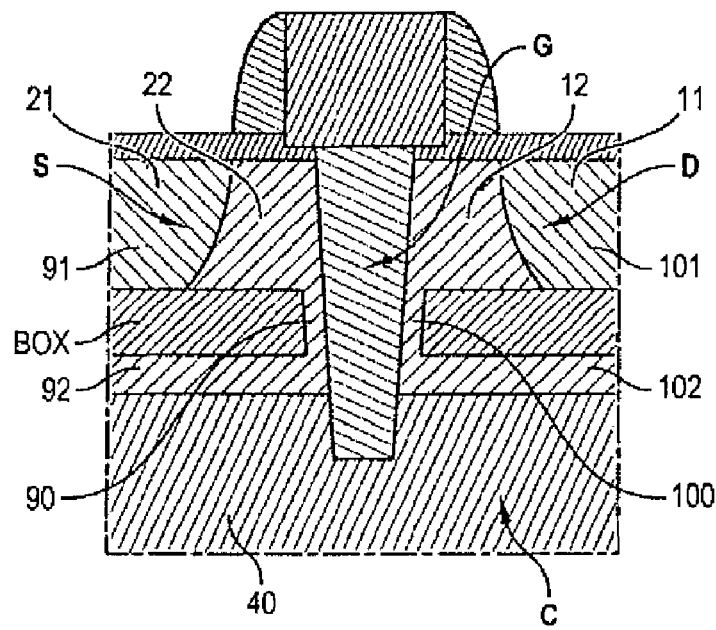
FIGS. 5a and 5b illustrate two examples of yet another embodiment of a memory cell according to the invention.

In the example illustrated in FIG. 5a, the parts 92 and 102 of the source and drain regions, respectively, located beneath the insulating layer are formed by a doped layer which is located on the surface of the base substrate, immediately beneath the insulating layer, and the conductivity of which is of the n⁻-type in the example considered here of an n-FET transistor. This doped layer comprises a source region 92 and a drain region 102 separated from each other by the trench.

Figure 5B:
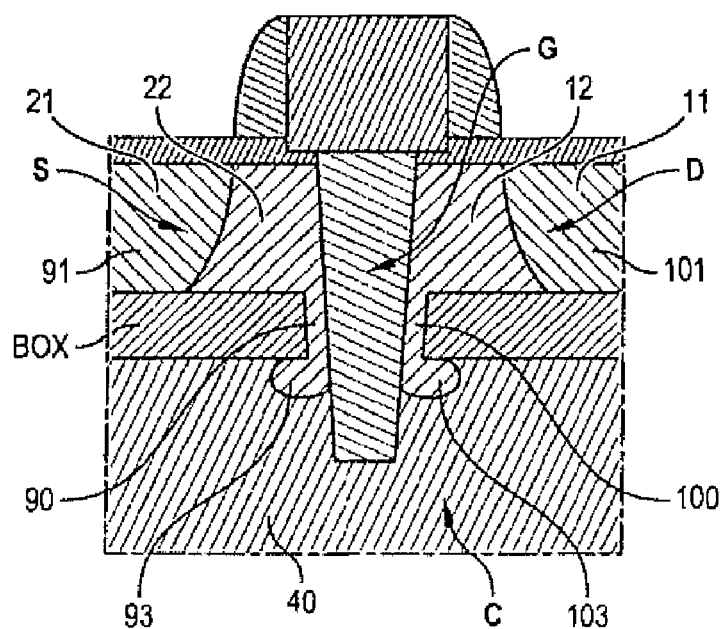

In the example illustrated in FIG. 5b, the parts 93 and 103 of the source and drain regions, respectively, located beneath the insulating layer are formed respectively by a localized source region and by a localized drain region, each placed immediately beneath the insulating layer on either side of the trench. These localized zones 93 and 103 form source and drain reservoirs or pockets respectively. The channel extends, preferably integrally (that is, preferably all with any residual amount having no commercial or practical effect), beneath the insulating layer between these reservoirs or pockets. The examples illustrated in FIGS. 5a and 5b may be combined by adding the pockets similar to pockets 93 and 103 of FIG. 5b to the doped layer 92 and 102 of FIG. 5a.

Moreover, the second general embodiment may be implemented both for fully depleted memory cells (the case shown in FIGS. 5a and 5b) and for partially depleted memory cells (with in this case necessary STI isolation above the insulating layer in order to separate the cells from one another).

One possible method of producing the example of the second general embodiment illustrated in FIG. 5a is now explained in detail. First, the regions located beneath the insulating layer (well 40, emitter 80 (if present) and the layer intended to form the source 92 and drain 102 regions, for example) are formed before any process for fabricating front-face transistors by implanting dopants in the base substrate beneath the insulating layer.

Next, the trench is formed in the SeOI substrate in a manner similar to that carried out for forming the cell of FIG. 2a, the trench extending from the surface of the semiconductor-on-insulator substrate beyond the insulating layer, depthwise into the base substrate.

Next, as in the case of forming the cell illustrated in FIG. 2a, the walls of the trench are then covered with a layer of semiconductor material, preferably silicon, by conformal deposition of amorphous silicon or deposition of silicon using the ALD (atomic layer deposition) technique. A gentle etching operation may also be carried out in order to remove the deposited silicon layer present on top of the trench mask.

Next, the gate dielectric layer 31 (FIG. 2b) is formed along the walls of the trench. The trench is then filled in order to form the gate region G therein, for example by depositing doped polysilicon. As a variant, the gate region may be metallized.

Finally, a diffusion-annealing operation is carried out in order to make dopants diffuse along the walls on either side of the trench at the insulating layer level from the source and drain regions located respectively above and beneath the insulating layer. This diffusion creates source conduction zone 90 and drain conduction zone 100. Also, this diffusion-annealing operation recrystallizes the regions located beneath the insulating layer. In so far as the regions located above and beneath the insulating layer do not necessarily have the same crystalline orientation, the junction between two single crystals is as perfect as possible, but not absolute.

This recrystallization thus effectively minimizes or avoids generating crystal defects in the channel (p⁻-type) which can incidentally promote charge recombination deleterious to charge retention in the cell. To further minimize or avoid such crystal defects, the doped layer beneath the insulating layer intended to form the source region 92 and the drain region 102 beneath the insulating layer has the same conductivity (n⁺-type in the example) as the source region 91 and drain region 101 located above the channel.

After the diffusion-annealing operation, the source regions above 91 and below 92 the insulating layer and the drain regions above 101 and below 102 the insulating layer then extend through the insulating layer via the source conduction zone 90 and the drain conduction zone 100 respectively.

One possible method of producing the example of the second general embodiment illustrated in FIG. 5b is now explained in detail. The regions located beneath the insulating layer (well 40, emitter 80 (if present), for example) are formed before any process for fabricating front-face transistors by implanting dopants into the base substrate, beneath the insulating layer.

Next, a first trench is formed in the semiconductor-on-insulator substrate, the first trench extending from the surface of the semiconductor-on-insulator substrate down to the base substrate in such a way that the first trench has a thickness corresponding to the combined thicknesses of the thin layer and the insulating layer.

Next, the walls of the first trench are covered by spacers, which are n⁻-doped in the exemplary embodiment of an n-transistor shown here. To do this, doped polycrystalline silicon is for example deposited.

Next, a second trench is formed in the first trench, said second trench extending depthwise into the base substrate from the bottom of the first trench, the spacers defining the opening of said second trench.

Next, the gate dielectric layer 31 is formed along the walls of said second trench. Said second and first trenches are then filled in order to form the gate region G therein, for example by depositing doped polysilicon. As a variant, the gate region may be metallized.

Moreover, the localized source and drain regions 93, 103 immediately beneath the insulating layer on either side of the trench are formed by dopant diffusion into the base substrate from the spacers. The spacers thus define the source conduction zone 90 and the drain conduction zone 100 serving as conduction layer for connecting the source and drain regions that extend above and beneath the insulating layer.

This invention also provides a memory array comprising a plurality of memory cells according to any of the embodiments of the invention and also to processes improvements for fabricating such memory cells and such memory arrays.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

What is claimed is:

1. A memory cell comprising:
   a semiconductor-on-insulator (SeOI) substrate including a thin layer of semiconductor material separated from a base substrate by an insulating layer; and
   an FET transistor including a source region and a drain region that are arranged at least essentially in the thin layer of the SeOI substrate, a channel in which a trench is made, and a gate region in the trench,
   wherein the trench extends into the depth of the base substrate beyond the insulating layer, and
   wherein the channel extends between the source region and the drain region at least essentially beneath the insulating layer.

2. The memory cell of claim 1 wherein the volume of the channel below the insulating layer is 200 to 1000 times the volume of the channel above the insulating layer.

3. The memory cell of claim 1, wherein the drain region and the source region are arranged integrally in the thin layer of the SeOI substrate, and wherein a channel conduction region is arranged at the insulating layer level on either side of the trench so that the channel extends between the source region and the drain region both above and beneath the insulating layer via the channel conduction region.

4. The memory cell of claim 3, wherein the FET transistor is partially depleted, and further comprising lateral isolation regions for isolating that part of the channel located above the insulating layer.

5. The memory cell of claim 1, wherein the source and drain regions extend both above and beneath the insulating layer via a source conduction zone and a drain conduction zone, respectively, the zones being arranged at the insulating layer level on either side of the trench, and wherein the channel extends integrally beneath the insulating layer between the parts of the source and drain regions that are located beneath the insulating layer.

6. The memory cell of claim 1, wherein the gate region is separated from the channel by a dielectric layer.

7. The memory cell of claim 1, wherein that part of the channel beneath the insulating layer is formed by a well made in the upper part of the base substrate.

8. The memory cell of claim 7, wherein the well is isolated from the remaining part of the base substrate by a layer of opposite conductivity to that of the well.

9. The memory cell of claim 1, further comprising lateral isolation regions which extend depthwise beneath the insulating layer for isolating that part of the channel located beneath the insulating layer.

10. The memory cell of claim 1, wherein the channel is floating, and wherein the gate region serves as control gate electrode for driving the FET transistor.

11. The memory cell of claim 10, further comprising a bipolar transistor having a collector that serves as the channel for the FET transistor.

12. The memory cell of claim 11, wherein the source of the FET transistor serves as the base for the bipolar transistor.

13. The memory cell of claim 11, wherein the base substrate serves as the base for the bipolar transistor.

14. The memory cell of claim 1, wherein the gate region is floating, and wherein the FET transistor further comprises a control gate electrode isolated from the floating gate region via a dielectric layer.

15. A memory array comprising a plurality of memory cells of claim 1.

16. A memory array comprising a plurality of memory cells of claim 11.

17. A process for fabricating the memory cell of claim 1, which comprises:
providing the semiconductor-on-insulator substrate and an FET transistor,
forming a trench in the channel region that extends beyond the insulating layer;
providing the walls of the trench with a layer of a semiconductor material;
carrying out a recrystallization annealing operation on the semiconductor material on the walls of the trench so as to recrystallize the material in a single-crystalline state in the regions located above and beneath the insulating layer, and in a polycrystalline state at the insulating layer level, so as to define channel conduction regions on either side of the trench at the insulating layer level and the lateral faces of the trench;
providing the layer of semiconductor material on the walls of the trench with a dielectric layer; and
forming the gate by filling the trench.

18. The process according to claim 17, wherein the semiconductor material and the dielectric layer completely cover the walls of the trench.

19. The process according to claim 17, which further comprises:
forming, immediately beneath the insulating layer, a doped layer intended to define a further portion of the source region and a further portion of drain region that extend beneath the insulating layer on either side of a trench; and
causing dopant to diffuse along the walls of the trench at the insulating layer level from the source and drain regions located above and beneath the insulating layer respectively, so as to form a source conduction zone and a drain conduction zone enabling the source regions and the drain regions, which extend above and beneath the insulating layer, respectively, to be connected.

20. The process according to claim 19, wherein the semiconductor material and the dielectric layer completely cover the walls of the trench.

21. The process according to claim 17, which further comprises:
forming the first trench to extend from the surface of the semiconductor-on-insulator substrate down to the base substrate;
providing the walls of the first trench with spacers of a doped semiconductor material having a conductivity of the same type as those of the drain and source regions that extend above the insulating layer;
forming a second trench in the first trench, said second trench extending into the depth of the base substrate beyond the insulating layer from the bottom of the first trench;
providing the doped semiconductor material on the walls of said second trench and of the first trench with a dielectric layer;
forming the gate by filling the first and second trenches; and
forming localized source and drain regions immediately beneath the insulating layer on either side of the second trench by dopant diffusion from the spacers, the spacers serving, after dopant diffusion, as channel conduction zones and drain conduction zones respectively, in order to connect the source and drain regions that extend above and beneath the insulating layer.

22. The process according to claim 21, wherein the doped semiconductor material and the dielectric layer completely cover the walls of the trench.